(12) United States Patent
Seol et al.

(10) Patent No.: US 9,128,812 B2
(45) Date of Patent: Sep. 8, 2015

(54) SEMICONDUCTOR STORAGE DEVICE, SYSTEM, AND METHOD

(75) Inventors: Chang-kyu Seol, Osan-si (KR); Jun-jin Kong, Yongin-si (KR); Hong-rak Son, Anyang-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 479 days.

(21) Appl. No.: 13/610,917

(22) Filed: Sep. 12, 2012

(65) Prior Publication Data

US 2013/0103913 A1    Apr. 25, 2013

(30) Foreign Application Priority Data

Oct. 25, 2011    (KR) .................. 10-2011-0109429

(51) Int. Cl.
G06F 13/00    (2006.01)
(52) U.S. Cl.
CPC .................................... *G06F 13/00* (2013.01)
(58) Field of Classification Search
CPC .......................... G11C 16/0483; G11C 16/10
USPC ........................ 365/185.09, 185.24
See application file for complete search history.

(56) References Cited

U.S. PATENT DOCUMENTS

| | | | | |
|---|---|---|---|---|
| 7,545,677 B2* | 6/2009 | Lee et al. | ................ | 365/185.18 |
| 7,710,784 B2* | 5/2010 | Chu et al. | ................ | 365/185.22 |
| 7,821,837 B2* | 10/2010 | Chun et al. | ................ | 365/185.22 |
| 7,839,685 B2 | 11/2010 | Auclair et al. | | |
| 7,898,865 B2* | 3/2011 | Baek et al. | ................ | 365/185.2 |
| 7,900,100 B2 | 3/2011 | Gollub | | |
| 8,014,207 B2* | 9/2011 | Ryu et al. | ................ | 365/185.2 |
| 8,031,526 B1* | 10/2011 | Wu et al. | ................ | 365/185.18 |
| 8,051,240 B2* | 11/2011 | Dutta et al. | ................ | 711/103 |
| 8,060,806 B2* | 11/2011 | Shalvi et al. | ................ | 714/763 |
| 8,089,814 B2* | 1/2012 | Park | ................ | 365/185.25 |
| 8,107,295 B2* | 1/2012 | Lee et al. | ................ | 365/185.18 |
| 8,116,160 B2* | 2/2012 | Hwang | ................ | 365/211 |
| 8,125,832 B2* | 2/2012 | Mokhlesi | ................ | 365/185.22 |
| 8,127,202 B2* | 2/2012 | Cornwell et al. | ............ | 714/764 |

FOREIGN PATENT DOCUMENTS

KR    10-2010-0124892 A    11/2010
KR    10-2010-0127406 A    12/2010

* cited by examiner

*Primary Examiner* — Michael Tran
(74) *Attorney, Agent, or Firm* — Muir Patent Law, PLLC

(57) ABSTRACT

A semiconductor storage system includes: a difference determining circuit configured to determine a difference between the number of first state values of sample data written to a memory and the number of first state values of read data read from the memory; and a compensation value determining circuit configured to determine a read voltage level compensation value corresponding to a difference between the number of the first state values of the sample data written to the memory and the number of the first state values of the read data read from the memory.

20 Claims, 7 Drawing Sheets

SEMICONDUCTOR STORAGE DEVICE, SYSTEM, AND METHOD

CROSS-REFERENCE TO RELATED APPLICATIONS

This application claims the benefit of Korean Patent Application No. 10-2011-0109429, filed on Oct. 25, 2011, in the Korean Intellectual Property Office, the disclosure of which is incorporated herein in its entirety by reference.

BACKGROUND

The present disclosure relates to a semiconductor storage device and system, and more particularly, to a semiconductor storage device and system in which a read voltage level is compensated.

In semiconductor storage systems, a read voltage level for reading data varies due to deterioration of oxide layers, a charge loss mechanism, variation in ambient temperature, or the like caused as the semiconductor systems are used. When the read voltage level is varied, and if data is read at an initially set read voltage level, it is often the case that the data is not correctable using error correcting codes (ECC). Accordingly, a method of measuring how much the read voltage level is varied compared to the initial read voltage level may be used. In this case, the frequency of reading should be minimized to prevent a decrease in read speed.

SUMMARY

The present disclosure provides a semiconductor storage device and system in which a read voltage level compensation value is determined without a decrease in a read speed.

According to one exemplary embodiment, there is provided a semiconductor storage system comprising: a difference determining circuit configured to determine a difference between the number of first state values of sample data written to a memory and the number of first state values of read data read from the memory; and a compensation value determining circuit configured to determine a read voltage level compensation value corresponding to a difference between the number of the first state values of the sample data written to the memory and the number of the first state values of the read data read from the memory.

The semiconductor storage system may further comprise a memory cell array configured to store the read data; a voltage source connected to the memory cell array; and an adjustment circuit configured to adjust a voltage supplied by the voltage source to the memory cell array based on the compensation value.

The semiconductor storage system may further comprise a generating circuit configured to generate the sample data, wherein data written to the memory is the sample data generated by using the generating circuit.

The semiconductor storage system may be a single level cell (SLC) NAND flash memory, and the compensation value determining circuit may calculate a read voltage level compensation value by using a fact that the number of first state values in the read data is equal to the sum of a value obtained by multiplying the number of second state values in the sample data and a probability that the second state values of the sample data may be read as the first state values and a value obtained by multiplying the number of the first state values in the sample data and a probability that the first state values of the sample data may be read as the first state values.

The semiconductor storage system may be a multi level cell (MLC) NAND flash memory that stores one of first through n-th state values of each memory cell, and the compensation value determining circuit may calculate a read voltage level compensation value by using a fact that the number of first state values in the read data is equal to the sum of a value obtained by multiplying the number of second through n-th state values in the sample data and a probability that the second through n-th state values may be read as the first state values and a value obtained by multiplying the number of the first state values in the sample data and a probability that the first state values of the sample data may be read as the first state values.

The compensation value determining circuit may determine a read voltage level compensation value corresponding to the difference in the first state values between the sample data written to the memory and the read data read from the memory based on a look-up table (LUT).

The semiconductor storage system may further comprise a controller that includes the difference determining circuit and the compensation value determining circuit.

The semiconductor storage system may be a NAND flash memory system.

According to another exemplary embodiment, there is provided a semiconductor device comprising: an array for receiving sample data and recording the sample data; a buffer for reading and storing the sample data written to the array; a first circuit for determining a difference between the number of arbitrary state values of data written to a memory and the number of state values of data read from the memory; and a second circuit for determining a read voltage level compensation value corresponding to the calculated difference between the numbers of the state values.

The semiconductor storage device may further comprise a circuit for adjusting a voltage supplied by the voltage source to the memory based on the compensation value.

The semiconductor storage device may further comprise a circuit for generating the sample data, wherein the data written to the memory is the sample data generated by using the circuit.

The semiconductor storage device may be a single level cell (SLC) NAND flash memory, and the second circuit may determine a read voltage level compensation value by using a fact that the number of first state values in the read data is equal to the sum of a value obtained by multiplying the number of second state values in the sample data and a probability that the second state values of the sample data may be read as the first state values and a value obtained by multiplying the number of the first state values in the sample data and a probability that the first state values of the sample data may be read as the first state values.

The semiconductor storage device may be a multi level cell (MLC) NAND flash memory that stores one of first through n-th state values of each memory cell, and the second circuit may determine a read voltage level compensation value by using a fact that the number of first state values in the read data is equal to the sum of a value obtained by multiplying the number of second through n-th state values in the sample data and a probability that the second through n-th state values may be read as the first state values and a value obtained by multiplying the number of the first state values in the sample data and a probability that the first state values of the sample data may be read as the first state values.

The second circuit may determine a read voltage level compensation value corresponding to the difference in the state values between the data written to the memory and the data read from the memory based on a look-up table (LUT).

The semiconductor storage system may further comprise a controller that includes the first circuit and the second circuit.

In a further exemplary embodiment, a method of operating a semiconductor device is disclosed. The method includes: receiving and storing sample data in a first plurality of storage cells; reading the sample data and storing the sample data as read data in a second plurality of storage cells; determining a difference between the number of storage cells of the first plurality of storage cells that store data having a particular state, and the number of storage cells of the second plurality of storage cells that store data having the particular state; and determining a read voltage level compensation value based on the determined difference.

The method may additionally include adjusting the read voltage level based on the read voltage level compensation value; and applying the adjusted read voltage level when performing read operations on the semiconductor device.

In one exemplary embodiment, the first plurality of storage cells are single level cells (SLCs), and storing sample data in the first plurality of storage cells causes each cell to be in either a high state or a low state; the second plurality of storage cells are single level cells (SLCs), and storing read data in the second plurality of storage cells causes each cell to be in either a high state or a low state; and the particular state is either the high state or the low state.

In another exemplary embodiment, the first plurality of storage cells are multi-level cells (MLCs), and storing sample data in the first plurality of storage cells causes each cell to be in one of a plurality of N states, N being a natural number 3 or greater; the second plurality of storage cells are multi-level cells (MLCs), and storing read data in the second plurality of storage cells causes each cell to be in one of a plurality of N states, N being a natural number 3 or greater; and the particular state is one of the N states.

The method may further include determining the read voltage level compensation value by either calculating the value or by using a lookup table.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
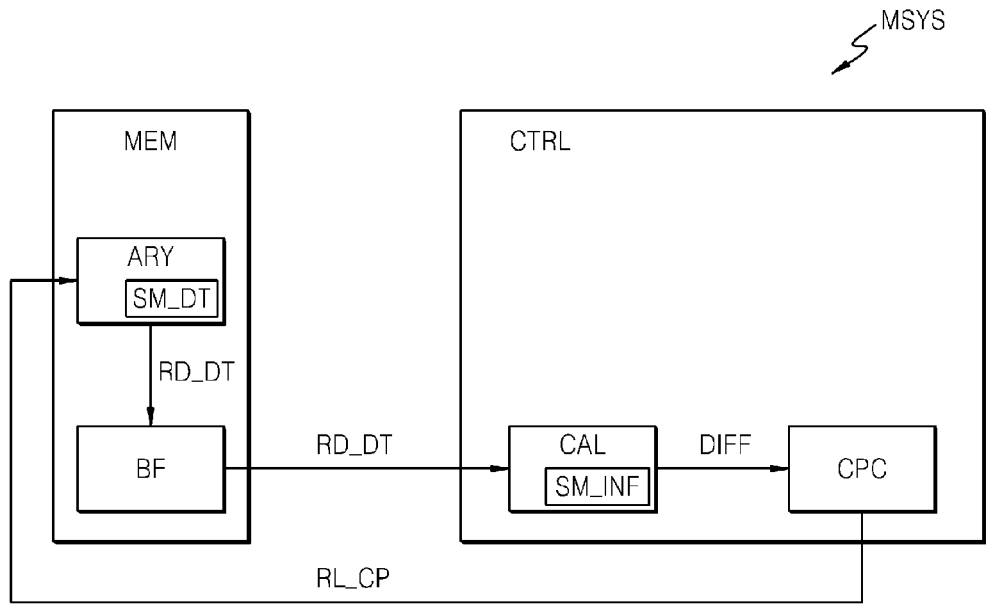
FIG. 1 is a block diagram illustrating a semiconductor storage system according to an exemplary embodiment.

The attached drawings for illustrating certain embodiments of the are referred to in order to gain a sufficient understanding of the present disclosure.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Unless defined differently, all terms used in the description including technical and scientific terms have the same meaning as generally understood by those of ordinary skill in the art. Terms as defined in a commonly used dictionary should be construed as having the same meaning as in an associated technical context, and unless defined apparently in the description, the terms are not ideally or excessively construed as having any formal meaning.

Hereinafter, exemplary embodiments will be described in detail with reference to the attached drawings. Like reference numerals in the drawings denote like elements.

FIG. 1 is a block diagram illustrating a semiconductor storage system MSYS according to an exemplary embodiment.

Referring to FIG. 1, the semiconductor storage system MSYS includes a memory unit MEM and a control unit CTRL. The memory unit MEM includes an array ARY and a buffer BF. In one embodiment, the control unit CTRL includes a calculating unit CAL and a compensation value calculating unit CPC.

The semiconductor storage system MSYS may be a NAND flash memory system. However, the semiconductor storage system MSYS is not limited thereto, and may also be various memories such as a random-access memory (RAM), a read only memory (ROM), a dynamic random access memory (DRAM), a synchronous dynamic random access memory (SDRAM) or a NOR flash memory, or other large capacity storage devices such as a solid state disk (SSD) or a hard disk drive (HDD).

The memory unit MEM refers to a physical storage space to which data is written or from which data is read. For example, if the semiconductor storage system MSYS is a NAND flash memory system, the memory unit MEM may refer to a physical storage space in which data is programmed or erased, and may include, for example, word lines, bit lines, and other known NAND flash memory components. The array ARY may refer to a main space in which data is stored. The buffer BF is a temporary storage space in the memory unit MEM. The buffer BF may be, for example, a dynamic random access memory (DRAM).

The control unit CTRL may be a controller including various circuitry configured to control the memory unit MEM. The circuitry discussed herein may include, for example, transistors, resistors, communication lines, switches, inverters, and other known circuit elements. The calculating unit CAL may be, for example, a first circuit. The first circuit may include known circuit elements configured to perform certain operations such as those described herein. The first circuit may be more generally described as a difference determining circuit, as discussed in more detail below. The compensation value calculating unit CPC may be, for example, a second circuit. The second circuit may also include known circuit elements configured to perform certain operations such as those described herein. The second circuit may be more generally described as a compensation value determining circuit, as discussed in more detail below.

In one exemplary embodiment, to compensate for a voltage level at which data is read by the memory unit MEM, the control unit CTRL compares a plurality of pieces of sample data SM_DT and a plurality of pieces of read data RD_DT to calculate a read voltage level compensation value RL_CP and transmits the calculated read voltage level compensation value RL_CP to the memory unit MEM.

Sample data refers to data that is to be read to calculate a read voltage level. Sample data may encompass both data recorded to a memory cell array and data that is additionally generated to be read out. For example, the sample data may be test data having an arbitrary value. The data may be stored in a first memory cell array. The data may then be read from the array and stored elsewhere (such as a buffer), so that the read data can be compared to the test data stored in the first memory cell array. The sample data may be generated, and when it is generated, information about the generated sample data may be stored. For example, a controller can store the value of the sample data.

In one embodiment, the calculating unit CAL, which may be a first circuit, counts the number of occurrences of a particular state value of the read data RD-DT (e.g., a number of cells that store that state value). For example, in a single level cell (SLC) NAND flash memory, the number of 1's or 0's may be counted. According to another embodiment, in a multi level cell (MLC) NAND flash memory, the number of occurrences of states such as E(1,1) (erase state), P1(0,0) (first programming state), P2(1,0) (second programming state) or P3(0,1) (third program state) may be counted. In one embodiment, the calculating unit CAL calculates a difference between the number of occurrences of a particular state value in sample data and the number of occurrences of the particular state value of read data. For example, if sample data of {1, 0, 1, 1, 0, 1, 1, 1, 0, 1} is assumed to be in a SLC NAND flash memory, read data may be {0, 0, 1, 1, 0, 1, 1, 1, 0, 1} due to a variation in a read voltage level. Here, first data is changed from "1" to "0," and the rest is not changed. In sample data, there are three 0s, and there are four 0s in the read data. Here, the calculating unit CAL may calculate that a difference between numbers of 0 state values is one. However, the number of pieces of sample data is exemplary and may be varied according to memory size without limiting the scope of the inventive concept. For example, the number of sample data may be 8 Kbytes. If the number of sample data is 8 Kbytes, a difference between the numbers of state values may be calculated as 100 or 1000. In addition, the particular state value compared may vary, and may be predetermined according to an arbitrary selection. Also, although a first circuit is described in this embodiment as a calculating unit CPC, the difference between the numbers of state values may be determined using other methods. As such, the first circuit for determining the difference between the numbers of state values is also referred to herein as a difference determining circuit.

In one embodiment, the compensation value calculating unit CPC, which may be a second circuit, calculates a read voltage level compensation value according to a difference DIFF in the numbers of state values calculated in the calculating unit CAL. Although a second circuit is described in this embodiment as a compensation value calculating unit CPC, as discussed further below, the compensation value may be determined using other methods. As such, the second circuit for determining the compensation value is also referred to herein as a compensation value determining circuit.

In one embodiment, the method of calculating a compensation value may be performed by using the fact that if there is one read voltage level (e.g., a SLC NAND flash memory), the number of 1s in read data is equal to the sum of a value obtained by multiplying the number of 0s in sample data by a probability that a 0 of the sample data may be read as 1 and a value obtained by multiplying the number of 1s in the sample data by a probability that a 1 of the sample data may be read as 1. On the other hand, the method of calculating a compensation value may also use the fact that the number of 0s in read data is equal to the sum of a value obtained by multiplying the number of 1s in sample data and a probability that a 1 of the sample data may be read as 0 and a value obtained by multiplying the number of 0 in the sample data and a probability that a 0 of the sample data may be read as 0. The above relations may be expressed by the following equation.

$$N_1 = n_0 \Pr(d'=1|d=0,D) + n_1 \Pr(d'=1|d=1,D) \qquad \text{[Equation 1]}$$

Here, $N_1$ denotes the number of 1s of read data. $n_0$ denotes the number of 0s included in sample data, $n_1$ denotes the number of 1s included in the sample data. d denotes a value of sample data, and d' denotes a value of read data. D denotes a read voltage level before correction (for example, a read reference voltage). For example, in this equation, D refers to a voltage level at which the number of 1's ($N_1$) occur. Also, Pr(d'=s'|d=s, D) denotes a probability that sample data s may be read as read data s' at a read voltage level D. Briefly, Pr(d'=s'|d=s) may be defined as $P_{e|s}(D)$. That is, Pe|s(D) refers to the probability that sample data s may be read as read data s'. Accordingly, Equation 1 may be rearranged as follows.

$$\begin{aligned} N_1 &= n_0 P_{e|0}(D) + n_1(1 - P_{e|1}(D)) \qquad \text{[Equation 2]} \\ &= \left(\frac{N}{2} - \Delta\right) P_{e|0}(D) + \left(\frac{N}{2} + \Delta\right)(1 - P_{e|1}(D)) \end{aligned}$$

Here, N denotes a size of sample data, for example, a size of a single page. Accordingly, it may be expressed as $n_0=(N/2-\Delta)$ and $n_1=(N/2+\Delta)$. The sum of the number of 0s included in sample data and the number of 1s included in the sample data is equal to the size of the sample data. Equation 2 may be rearranged as follows.

$$\frac{2}{N}(N_1 - n_1) = P_{e|0}(D) - P_{e|1}(D) - \varepsilon \qquad [\text{Equation 3}]$$

Here, $\varepsilon=(2/N)(\Delta(P_{e|0}(D)+P_{e|1}(D)))$. However, in Equation 3, according to one embodiment, sample data is random data, and accordingly, if assuming that the number of 0s and the number of 1s in the sample data are almost the same, a difference $\Delta$ between the number of 0s and the number of 1s in the sample data converges to 0 as N increases. Accordingly, Equation 3 may be rearranged as follows.

$$\frac{2}{N}(N_1 - n_1) \approx P_{e|0}(D) - P_{e|1}(D) \qquad [\text{Equation 4}]$$

Here, in read data, if assuming a normal distribution with an average $\mu_0$ of program states (corresponding to bit 0) and a standard deviation $\sigma_0$, $P_{e|0}(D)$ may be expressed as:

$$P_{e|0}(D) = Q\left(\frac{\mu_0 - D}{\sigma_0}\right);$$

if assuming a normal distribution with an average $\mu_1$ of an erase state (corresponding to bit 1) and a standard deviation $\sigma_1$, $P_{e|1}(D)$ may be expressed as $$P_{e|1}(D) = Q\left(\frac{D - \mu_1}{\sigma_1}\right).$$

Here, $$Q(x) = \frac{1}{\sqrt{2\pi}} \int_{\infty}^{\infty} \exp\left(-\frac{y^2}{2}\right) dy.$$

Accordingly, Equation 4 may be rearranged as follows.

$$(N_1 - n_1) = \frac{N}{2}\left[Q\left(\frac{\mu_0 - D}{\sigma_0}\right) - Q\left(\frac{D - \mu_1}{\sigma_1}\right)\right] \qquad [\text{Equation 5}]$$

$N_1-n_1$ represents a difference between the number of occurrences of a particular a state value (e.g., 1's) of read data and the number of occurrences of the particular state value of sample data. The right side of Equation 5 is defined as g(D−D*), where D* is an optimum read voltage level. Equation 5 may be rearranged as follows.

$$D-D^* = g^{-1}(N_1 - n_1) \qquad [\text{Equation 6}]$$

Here, $g^{-1}(N_1-n_1)$ is an inverse function of g(D−D*). $g^{-1}(N_1-n_1)$ may be calculated by using an expression of g(D−D*) corresponding to the right side of Equation 5. Also, $g^{-1}(N_1-n_1)$ may be calculated by numerical interpretation. Hereinafter, the calculation of $g^{-1}(N_1-n_1)$ will be described in detail with reference to FIG. 3. The compensation value calculating unit CPC may determine a read voltage level compensation value D−D*. As shown in the equation above, in one embodiment, a read voltage level compensation value is based on a difference between the number of occurrences of a particular a state value (e.g., 1's) of read data and the number of occurrences of the particular state value of sample data. The read voltage level compensation value may be determined according to a calculation that uses the difference.

Referring to the exemplary embodiment of FIG. 1 again, sample data SM_DT is written or programmed to the memory unit MEM and read to be stored in the buffer BF. Read data RD_DT stored in the buffer BF is data that is read at the read voltage level D. The calculating unit CAL determines the number of 0s or 1s in read data and sample data (from SLC) or the number of each of states (from MLC). Accordingly, the calculating unit CAL may calculate a difference between the numbers of 1s in the read data RD_DT and the sample data SM_DT. Information SM_INF about sample data SM_DT may be included in the calculating unit CAL. For example, the information SM_INF may include the calculated difference. The difference DIFF determined in this manner is transmitted to the compensation value calculating unit CPC, and the compensation value calculating unit CPC determines a read voltage level compensation value RL_CP, for example, D−D* in Equation 6, by using the difference DIFF and outputs the same. The compensation value calculating unit CPC transmits a read voltage level compensation value RL_CP to the memory unit MEM, and the memory unit MEM may update a new read voltage level by using the read voltage level compensation value RL_CP. The read voltage level may therefore be adjusted by the read voltage level compensation value RL_CP, and a new read voltage level may then be used to perform read operations on the semiconductor device. For example, the adjusted read voltage level may be applied to word lines of a memory cell array of the semiconductor device in order to read the data stored in the memory cells of the memory cell array. The calculation as described above is possible because probabilities that noise or the like occurs in every memory unit are almost the same. Accordingly, a read voltage level may be updated by performing reading one time.

Figure 2:
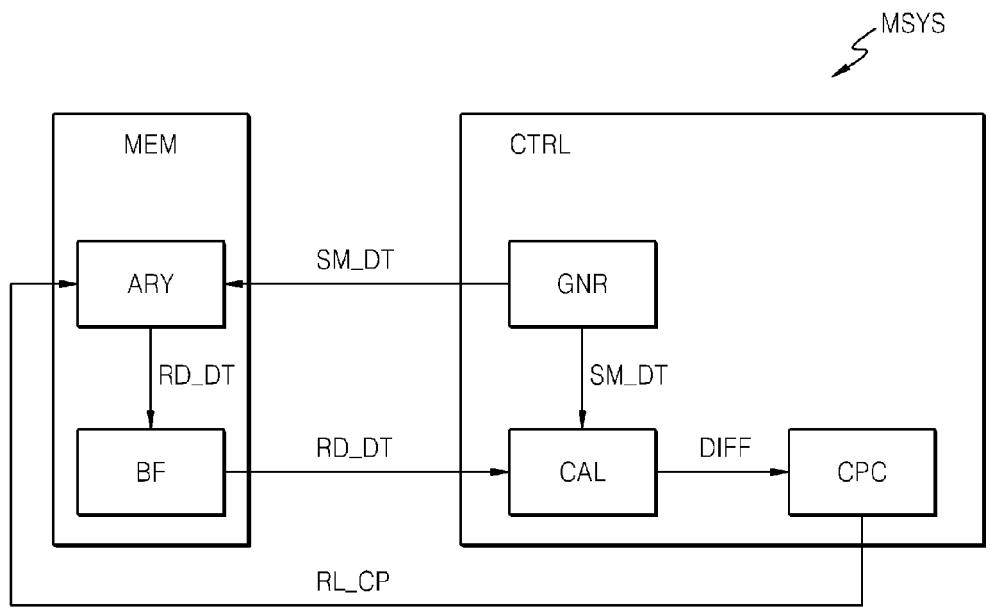
FIG. 2 is a block diagram illustrating a semiconductor storage system according to another exemplary embodiment.

FIG. 2 is a block diagram illustrating a semiconductor storage system MSYS according to another exemplary embodiment.

Referring to FIG. 2, a control unit CTRL may include a generating unit GNR. The generating unit GNR may include a circuit. The circuit may include known circuit elements configured to perform certain operations. The generating unit GNR allows sample data to be written to the memory unit MEM, and generates read data RD_DT obtained by reading the sample data. For example, in a SLC NAND flash memory, sample data of {1, 0, 1, 1, 0, 1, 1, 1, 0, 1} may be generated. However, the number of pieces of sample data is exemplary and does not limit the scope of the present disclosure. The number of pieces of sample data may vary according to memory size. For example, the number of pieces of sample data may be 8 Kbytes. The other elements shown in FIG. 2 may operate and be configured similarly to the same named elements in FIG. 1.

Figure 3:
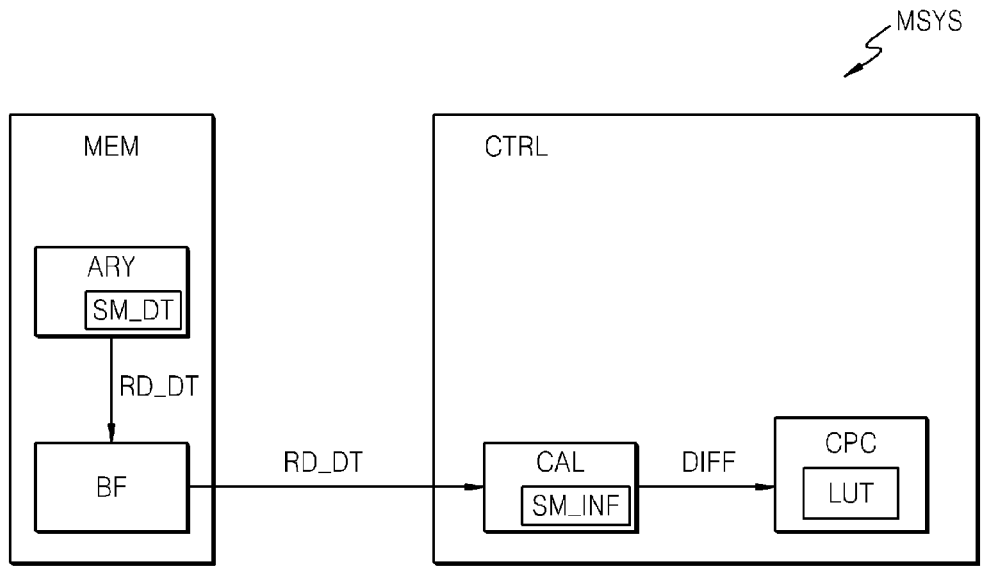
FIG. 3 is a block diagram illustrating a semiconductor storage system according to another exemplary embodiment.

FIG. 3 is a block diagram illustrating a semiconductor storage system MSYS according to another exemplary embodiment.

Referring to FIG. 3, a compensation value calculating unit CPC may include a lookup table LUT. However, a lookup table is not necessarily included in the compensation value calculating unit CPC but may also be included in a memory of another controller. To describe the semiconductor storage system MSYS by comparing with FIG. 1, a read voltage level compensation value may be calculated using the equation of g(D−D*) corresponding to the right side of Equation 5 as in the case of FIG. 1. Also, a read voltage level compensation value may also be determined by numerical interpretation. For example, methods such as filtering based on polynomial approximation or using a lookup table (LUT) are examples of numerical interpretation. In the LUT, read voltage level compensation values corresponding to a difference between the numbers of state values are mapped in LUT according to Equation 5. Accordingly, the LUT may have data indicating read voltage level compensation values corresponding to the number of state values or less. A read level compensation value may be determined by a compensation value determining circuit using, for example, a LUT. For example, if the number of pieces of sample data is 8000, the LUT may have read voltage level compensation values corresponding to a difference in the numbers of state values of 8000 or less. Also, the LUT may have data indicating read voltage level compensation values corresponding to differences in the number of state values that are divided into sections. For example, if the size of sample data is 8000 bytes, the sample data may be divided into 800 sections each including ten pieces of sample data, differences between the numbers of state values may have 800 sections, and there may be a read voltage level compensation value for each section. Also, the differences between the numbers of state values are divided into sections adaptively with weights. For example, if the number of pieces of sample data is 8000, the sample data may be divided into a section where a difference between the number of state values is one to 1000, a section where a difference between the number of state values is 1001 to 1800, a section where a difference between the number of state values is 1801 to 2400, and a section where a difference between the number of state values is 2401 to 2800 such that the size of each section decreases while the difference in the numbers of state values converges to 0. When the compensation value calculating unit CPC includes a LUT, a read voltage level compensation value may be determined without calculating an algebraic expression.

Figure 4:
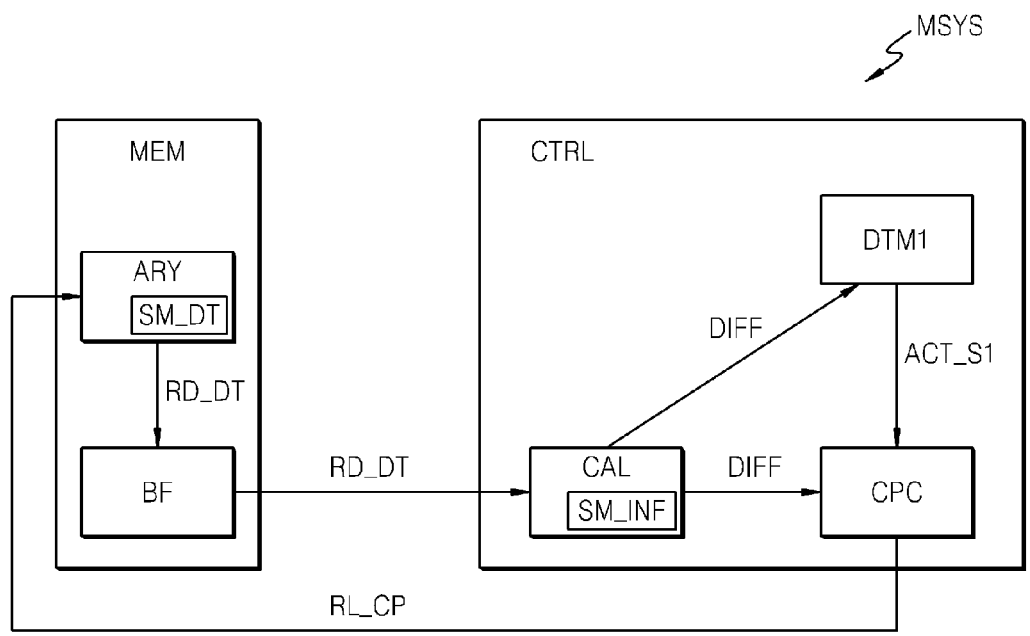
FIG. 4 is a block diagram illustrating a semiconductor storage system according to another exemplary embodiment.

FIG. 4 is a block diagram illustrating a semiconductor storage system MSYS according to another exemplary embodiment.

Referring to FIG. 4, a control unit CTRL may further include a first determination unit DTM1. The first determination unit DTM1 transmits a first activation signal ACT_S1 that activates a compensation value calculating unit CPC, to a read voltage level compensation unit RLC.

According to one embodiment, the first determination unit DTM1 determines whether a read voltage level has an error of a predetermined value or greater and if so, transmits the first activation signal ACT_S1 to the compensation value calculating unit CPC. The determination unit DTM1 may include a circuit. The circuit may include known circuit elements configured to perform certain operations. Whether a read voltage level has an error of a predetermined value or greater may be determined by using a difference DIFF received by the calculating unit CAL. In this case, before the first determination unit DTM1 transmits the first activation signal ACT_S1 to the compensation value calculating unit CPC, the compensation value calculating unit CPC does not receive a difference DIFF. After the first determination unit DTM1 has transmitted the first activation signal ACT_S1 to the compensation value calculating unit CPC, the compensation value calculating unit CPC receives a difference DIFF. Also, whether a read voltage level has an error of a predetermined value or greater may be determined every time when a frequency of data input, erasing or reading is equal to or greater than a reference frequency. Also, whether a read voltage level has an error of a predetermined value or greater may be determined every time data is input, erased or read.

Figure 5:
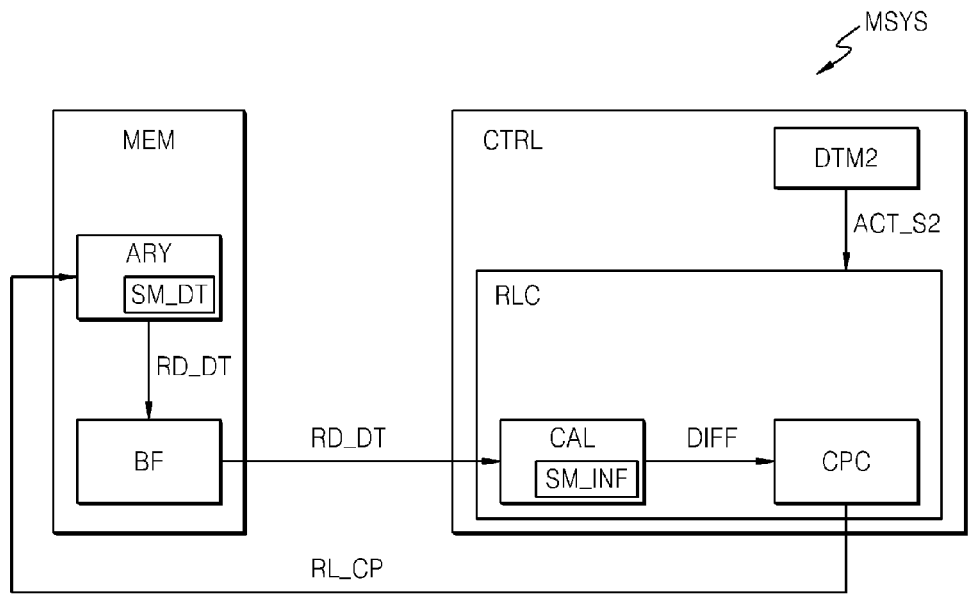
FIG. 5 is a block diagram illustrating a semiconductor storage system according to another exemplary embodiment.

FIG. 5 is a block diagram illustrating a semiconductor storage system MSYS according to another exemplary embodiment.

Referring to FIG. 5, a control unit CTRL may further include a second determining unit DTM2. The second determining unit DTM2 may include a circuit. The circuit may include known circuit elements configured to perform certain operations. The second determining unit DTM2 transmits an activation signal ACT_S2 that activates a read voltage level compensation unit RLC including a calculating unit CAL and a compensation value calculating unit CPC, to the read voltage level compensation unit RLC.

According to another embodiment, the second determining unit DTM2 determines whether a writing, erasing, or reading frequency is equal to or greater than a predetermined value, and may transmit a second activation signal ACT_S2 to the read voltage level compensating unit RLC. In this case, the second determining unit DTM2 may receive information about a writing, erasing, or reading frequency via the memory unit MEM. The predetermined value may be counted after the read voltage level is updated. Also, the predetermined value may be calculated by reflecting a frequency that a read voltage level is updated. For example, if a writing frequency is fifty times, and a read voltage level is updated for the first time, then the read voltage level may be updated when a writing frequency is 40 times.

According to another embodiment, the second determining unit DTM2 may determine a read voltage level compensation value RL_CP of the compensation value calculating unit CPC to be proportional to a difference between the number of arbitrary state values of sample data and the number of state values of read data, if a frequency of writing, erasing or reading is below a particular threshold, such as 10 times or less. In certain embodiments a smaller number of times may be more desirable, such as 5 times or less, 3 times or less, or even one time. By using Taylor Series, Equation 5 may be expressed by Equation 7 below.

$$\frac{2}{N}(N_1 - n_1) = P_{e|0}(D) - P_{e|1}(D) - \varepsilon \qquad \text{[Equation 7]}$$
$$\approx P_{e|0}(D^*) - P_{e|1}(D^*) +$$
$$(P'_{e|0}(D^*) - P'_{e|1}(D^*))(D - D^*)$$
$$\approx (P'_{e|0}(D^*) - P'_{e|1}(D^*))(D - D^*)$$

Here, as the writing/erasing frequency is small, and the difference between the current read voltage level and the optimum read voltage level is small, the read voltage level compensation value approaches 0, and accordingly, it may be that D≈D*. In this case, when P'$_{e|0}$(D*)−P'$_{e|1}$(D*) is developed by Taylor Series, it converges to a constant. Thus, Equation 7 may be rearranged as follows.

$$D - D^* = K(N_1 - n_1) \qquad \text{[Equation 8]}$$

Here, K is a positive constant value, and if a probability that data is 0 or 1 is guaranteed to be ½, Equation 8 may be rearranged as follows.

$$D - D^* = K\left(N_1 - \frac{N}{2}\right) \quad \text{[Equation 9]}$$

Here, N indicates the size of the whole sample data. By performing writing, erasing, or reading based on Equation 9 and updating a read voltage level each time, the compensation value calculating unit CPC may calculate a read voltage level compensation value RL_CP by counting the number of 1s from sample data, and an additional storage the number of 1s in sample data may not be necessary.

Figure 6:
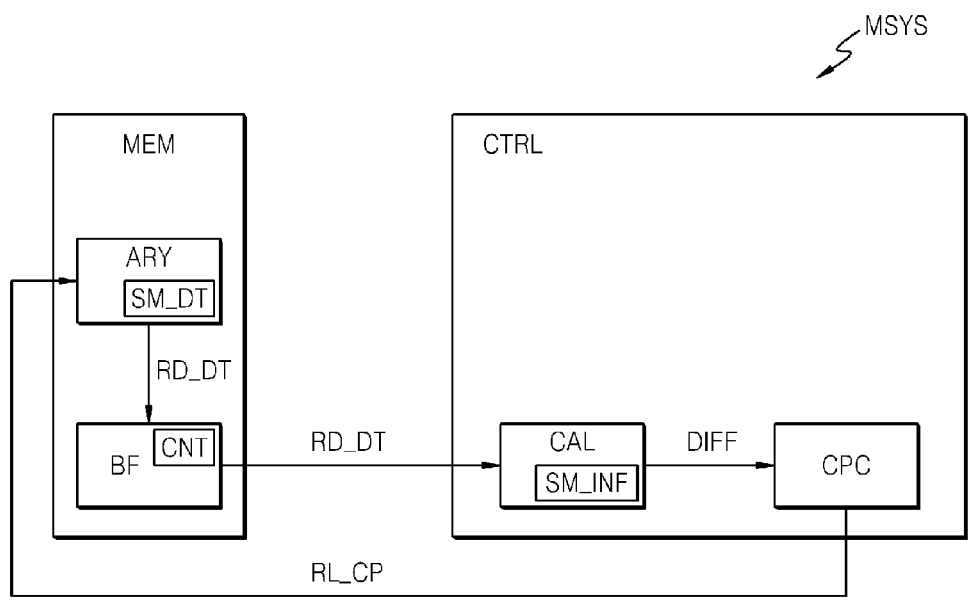
FIG. 6 is a block diagram illustrating a semiconductor storage system according to another exemplary embodiment.

FIG. 6 is a block diagram illustrating a semiconductor storage system MSYS according to another exemplary embodiment.

Referring to FIG. 6, a buffer BF included in a memory unit MEM may include a counting unit CNT that reads sample data and stores information about the number of predetermined state values. However, the current embodiment is not limited thereto, and a counting unit CNT may also be included in an additional register included in the memory unit MEM. The counting unit CNT may include a circuit. The circuit may include known circuit elements configured to perform certain operations. For example, sample data in a SLC NAND flash memory may be read to store the number of 1s in the counting unit CNT. The counting unit CNT may store the number of 1s of sample data for each word line WL. As long as the information about the number of the predetermined state values that is read is storable, the counting unit CNT may store the information in an external memory or in an additional space inside the memory unit MEM. In one embodiment, 2 bytes is necessary for read voltage level. For example, in one embodiment, in a 2-bit MLC NAND flash memory, the number of erase states, first programming states, and second programming states should be stored for each word line, and if a page size is 8 Kbytes, a necessary storage capacity is 6K bytes.

Figure 7:
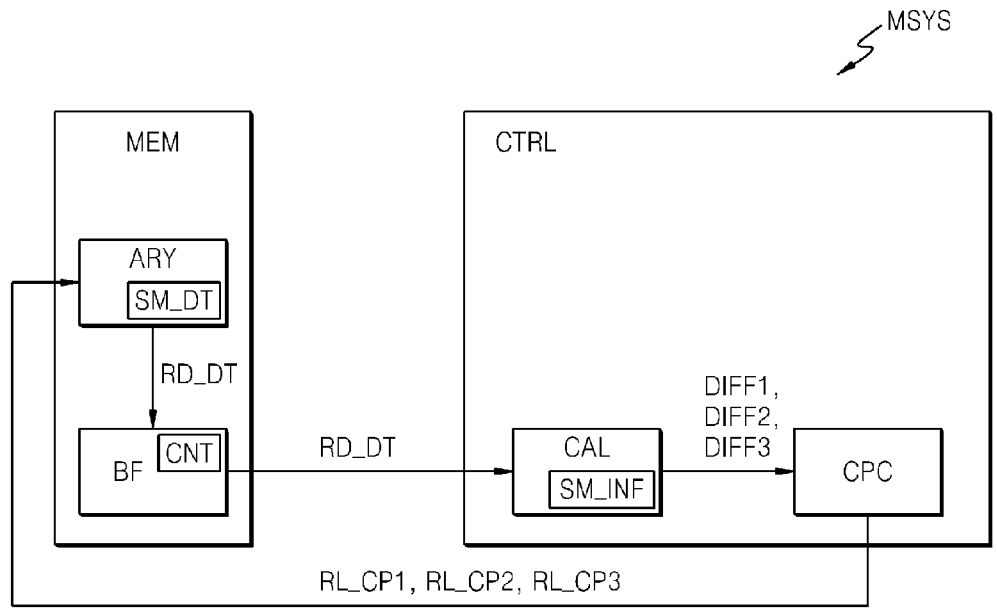
FIG. 7 is a block diagram illustrating a semiconductor storage system according to another exemplary embodiment.

FIG. 7 is a block diagram illustrating a semiconductor storage system MSYS according to another exemplary embodiment. Referring to FIG. 7, the semiconductor storage system MSYS is a 2-bit MLC NAND flash memory. A 2-bit MLC NAND flash memory has a total of three read voltage levels. A compensation value calculating unit CPC may calculate a read voltage level compensation value by using the fact that the number of predetermined state values in the read data is equal to the sum of a value obtained by multiplying the number of state values which are not the predetermined state value in the sample data and a probability that state values which are not the predetermined state values in the sample data may be read as the predetermined state values and a value obtained by multiplying the number of the predetermined state values in the sample data and a probability that the predetermined state values of the sample data may be read as the predetermined state values. In the 2-bit MLC NAND flash memory, an equation corresponding to Equation 5 is as follows:

$$g_1(D_1 - D_1^*) = \frac{N}{4}\left[Q\left(\frac{\mu_{P1} - D_1}{\sigma_{P1}}\right) - Q\left(\frac{D_1 - \mu_E}{\sigma_E}\right)\right] \quad \text{[Equation 10]}$$

$$g_2(D_2 - D_2^*) = \frac{N}{4}\left[Q\left(\frac{\mu_{P2} - D_2}{\sigma_{P2}}\right) - Q\left(\frac{D_2 - \mu_{P1}}{\sigma_{P1}}\right)\right]$$

$$g_3(D_3 - D_3^*) = \frac{N}{4}\left[Q\left(\frac{\mu_{P3} - D_3}{\sigma_{P3}}\right) - Q\left(\frac{D_3 - \mu_{P2}}{\sigma_{P2}}\right)\right]$$

Here, $D_1$ denotes a read voltage level between an erase state and a first programming state P1, and $D_1^*$ denotes an optimum read voltage level. $D_2$ denotes a read voltage level between the first programming state P1 and a second programming state P2, and $D_2^*$ denotes an optimum read voltage level. $D_3$ denotes a read voltage level between the second programming state P2 and a third programming state P3, and $D_3^*$ denotes an optimum read voltage level. Also, $\mu_E$, $\sigma_E$, and $n_E$ denote an average, a standard deviation, and the number of state values of sample data of the erase state, respectively. $\mu_{P1}$, $\sigma_{P1}$, and $n_{P1}$ denote an average, a standard deviation, and the number of state values of sample data of the first programming state P1. $\mu_{P2}$, $\sigma_{P2}$, and $n_{P2}$ denote an average, a standard deviation, and the number of state values of sample data of the second programming state P2.

The 2-bit MLC NAND flash memory may also perform a determination using the LUT of FIG. 3 in order to simplify and speed up calculation. Here, a LUT may be included for each read voltage level.

According to another exemplary embodiment, the semiconductor storage system MSYS may be a m-bit MLC NAND flash memory. The m-bit MLC NAND flash memory includes a total of $2^n-1$ read voltage levels. In this case, the compensation value calculating unit may calculate a read voltage level compensation value by using the fact that the number of first state values in read data is equal to the sum of a value obtained by multiplying the number of second through n-th state values in sample data and a probability that the second through n-th state values may be read as the first state values and a value obtained by multiplying the number of the first state values in the sample data and a probability that the first state values of the sample data may be read as the first state values. In the m-bit MLC NAND flash memory, an equation corresponding to Equation 5 is as follows.

$$g_i(D_i - D_i^*) = \frac{N}{2^m}\left[Q\left(\frac{\mu_{Pi} - D_i}{\sigma_{Pi}}\right) - Q\left(\frac{D_i - \mu_{Pi-1}}{\sigma_{Pi-1}}\right)\right], \quad \text{[Equation 11]}$$

$$i = 1, \ldots, 2^m - 1$$

Here, $D_i$ denotes a read voltage level between an i−1th programming state Pi−1 and an i-th programming state Pi, and $D_i^*$ denotes an optimum read voltage level. (A 0-th programming state corresponds to an erase state.) $\mu_{Pi}$, $\sigma_{Pi}$, and $n_{Pi}$ denote an average, a standard deviation, and the number of state values of sample data in the i-th programming state Pi.

Like the 2-bit MLC NAND flash memory, the m-bit MLC NAND flash memory may also perform determination by using the LUT of FIG. 3.

Referring to FIG. 7, the calculating unit CAL transfers a difference DIFF1 regarding $D_1$, a difference DIFF2 regarding $D_2$, and a difference DIFF3 regarding $D_3$, to the compensation calculating unit CPC. The compensation value calculating unit CPC calculates compensation values RL_CP1, RL_CP2, and RL_CP3 with respect to respective differences and transfers the same to an array ARY.

Figure 8:
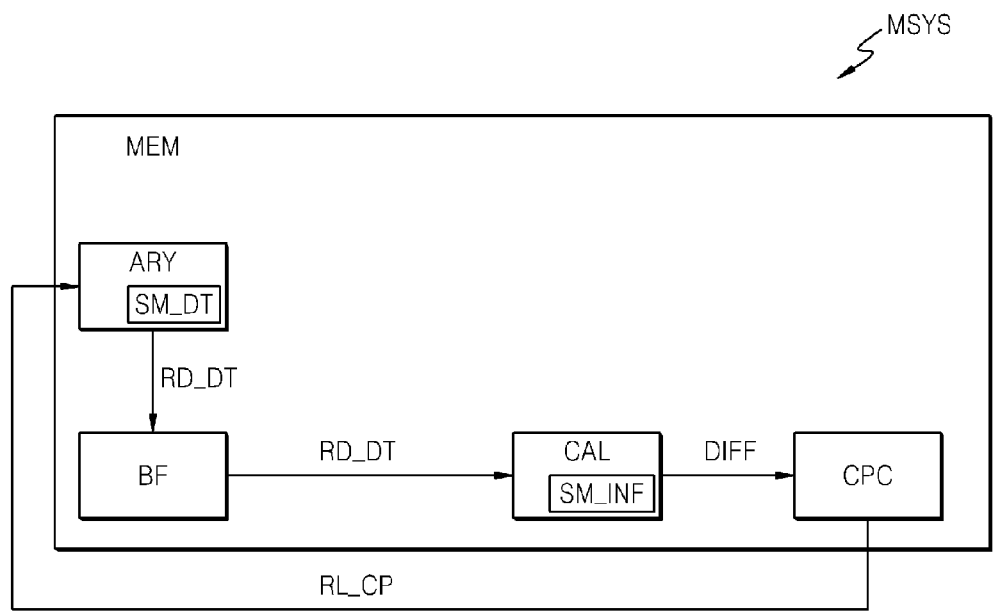
FIG. 8 is a block diagram illustrating a semiconductor storage system according to an exemplary embodiment.

FIG. 8 is a block diagram illustrating a semiconductor storage system MSYS according to another exemplary embodiment.

Referring to FIG. 8, the semiconductor storage device MSYS includes an array ARY, a buffer BF, a calculating unit CAL, a compensation value calculating unit CPC. The array ARY and the buffer BF may be the array ARY and the buffer BF included in the memory unit illustrated in FIG. 1, respectively. The calculating unit CAL and the compensation value calculating unit CPC may be the calculating unit CAL and the compensation value calculating unit CPC included in the control unit CTRL in FIG. 8, respectively. Sample data SM_DT may be written or programmed in a memory unit MEM, and may be read and stored in the buffer BF. Read data RD_DT stored in the buffer BF is data that is read at a read voltage level D. The calculating unit CAL determines the number of 0s or 1s in the sample data SM_DT (in SLC) or the number of each state value (in MLC). Accordingly, the calculating unit CAL calculates, for example, a difference between the number of 1s in read data RD_DT and sample data SM_DT. Information SM_INF about sample data SM_DT may be included in the calculating unit CAL. The difference DIFF calculated as described above is transferred to the compensation value calculating unit CPC, and the compensation value calculating unit CPC determines a read voltage level compensation value RL_CP, for example, D−D* in Equation 6, by using the difference DIFF and outputs the determined read voltage level compensation value RL_CP. The compensation value calculating unit CPC transfers the read voltage level compensation value RL_CP to the memory unit MEM, and the memory unit MEM may update a new read voltage level by using the read voltage level compensation value RL_CP.

Figure 9:
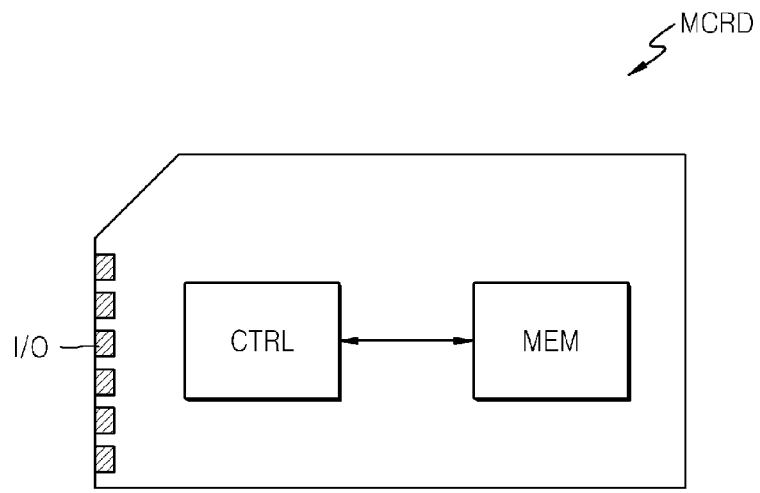
FIG. 9 is a block diagram illustrating a memory card according to an exemplary embodiment.

FIG. 9 is a block diagram illustrating a memory card MCRD according to certain exemplary embodiments.

Referring to FIG. 9, the memory card MCRD according to certain embodiments includes controller CTRL and a memory unit MEM. The memory controller CTRL responds to a request of an external host that is received via an input/output (I/O) unit to control data writing or data reading to or from the memory unit MEM. Also, the controller CTRL controls an erasing operation with respect to the memory unit MEM if the memory unit MEM of FIG. 9 is a flash memory device. In order to perform a control operation as described above, the memory controller CTRL of the memory card MCRD according to certain embodiments may include a plurality of interface units that perform interfacing with respective hosts and memory units and a RAM. In particular, the memory controller CTRL of the memory card MCRD according to certain embodiments may be the controller CTRL of FIG. 1 or the like. Also, the memory unit MEM of the memory card MCRD according to certain embodiments of the inventive concept may be the memory unit MEM of FIG. 1 or the like.

The memory card MCRD of FIG. 9 may be, for example, a compact flash card (CFC), a microdrive, a smart media card (SMC), a multimedia card (MMC), a security digital card (SDC), a memory stick, a universal serial bus (USB) flash memory driver, or the like.

Figure 10:
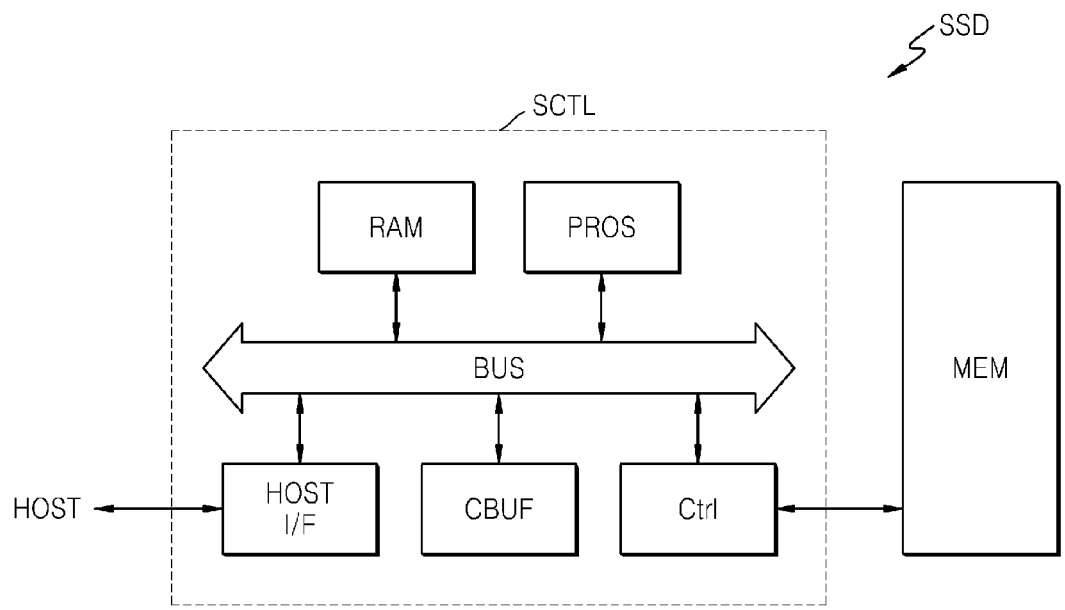
FIG. 10 is a schematic view a solid state drive (SSD) included as a semiconductor storage system according to an exemplary embodiment.

FIG. 10 is a schematic view a solid state drive (SSD) included as a semiconductor storage system MSYS according to certain exemplary embodiments.

Referring to FIG. 10, the SSD includes a SSD controller SCTL and a memory unit MEM. The SSD controller SCTL may include a processor PROS, a RAM, a cash buffer CBUF, and a memory controller CTRL that are connected to a bus BUS. The processor responds to a request of a host (command, address, or data) to control the memory controller CTRL to transmit or receive data of the memory unit MEM. The processor PROS and the memory controller CTRL of the SSD according to the current embodiment may also be implemented using a single Advanced RISC Machine (ARM) processor. Data that is necessary for operating the processor PROS may be loaded in the RAM.

A host interface HOST/IF receives a request of a host and transmits the same to the processor PROS, or transmits data that is transmitted from the memory unit MEM, to the host. The host interface HOST/IF may be various interface protocols such as Universal Serial Bus (USB), Man Machine Communication (MMC), Peripheral Component Interconnect-Express (PCI-E), Serial Advanced Technology Attachment (SATA), Parallel Advanced Technology Attachment (PATA), Small Computing system Interface (SCSI), Enhanced Small Device Interface (ESDI), or Intelligent Drive Electronics (IDE), and may perform interfacing with the host. Data that is to be transmitted to the memory unit MEM or that is transmitted from the memory unit MEM may be temporarily stored in the case buffer CBUF. The cash buffer CBUF may be, for example, a static random access memory (SRAM).

The memory controller CTRL and the memory unit MEM included in the SSD according to certain embodiments may be the memory controller CTRL and the memory unit MEM of FIG. 1 or the like, respectively.

The semiconductor storage systems MSYS according to the embodiments described above may be mounted using various forms of packages. For example, the semiconductor memory device may be mounted by using various packages such as a package on package (PoP), ball grid arrays (BGAs), chip scale packages (CSPs), plastic leaded chip carriers (PLCC), plastic dual in-line packages (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), or the like.

Figure 11:
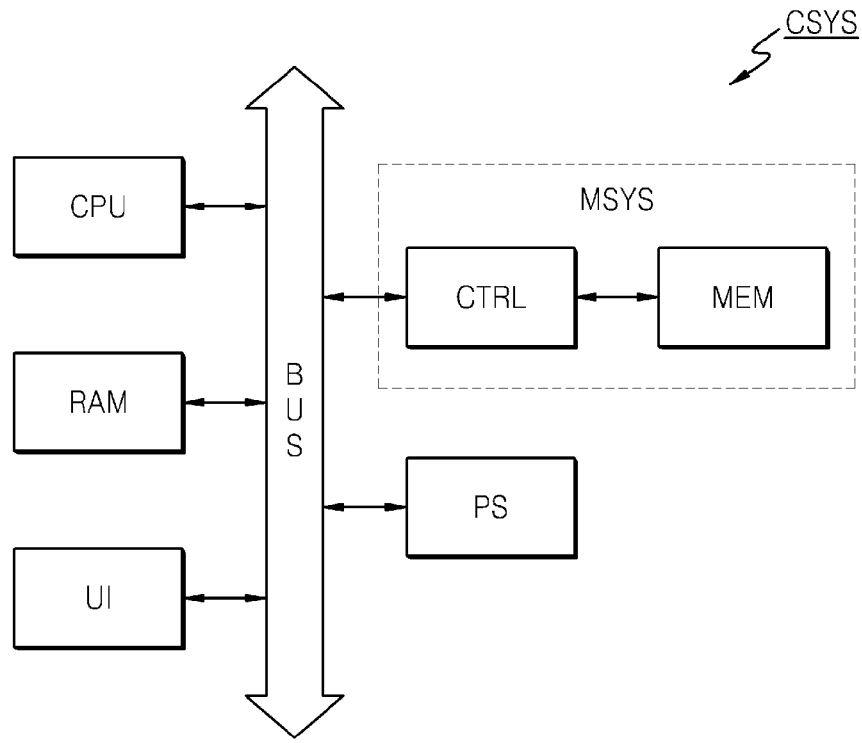
FIG. 11 is a block diagram illustrating a computing system including a semiconductor storage system according to an exemplary embodiment.

FIG. 11 is a block diagram illustrating a computing system CSYS including a semiconductor storage system MSYS according to an exemplary embodiment.

Referring to FIG. 11, the computing system CSYS according to one embodiment may include a processor (central processing unit, CPU), a system memory (RAM), and a semiconductor memory system MSYS which are electrically connected to a bus BUS. The semiconductor memory system MSYS includes a memory controller CTRL and a memory unit MEM. N-bit data (where N is an integer equal to or greater than 1) that is processed/to be processed by the processor (CPU) will be stored in the semiconductor memory unit MEM. The semiconductor memory system MSYS of FIG. 11 may be identical to the semiconductor memory system MSYS of FIG. 1. Also, the computing system CSYS of FIG. 11 may further include a user interface UI and a power supply unit PS that are electrically connected to the bus BUS.

If the computing system CSYS of FIG. 11 or the like according to certain embodiments is a mobile device, a battery for supplying an operating voltage of the computing system CSYS and a modem such as a baseband chipset may be additionally provided. Also, an application chipset, a camera image processor (CIS), a mobile DRAM or the like may be further provided to the computing system CSYS according to the certain embodiments.

Figure 12:
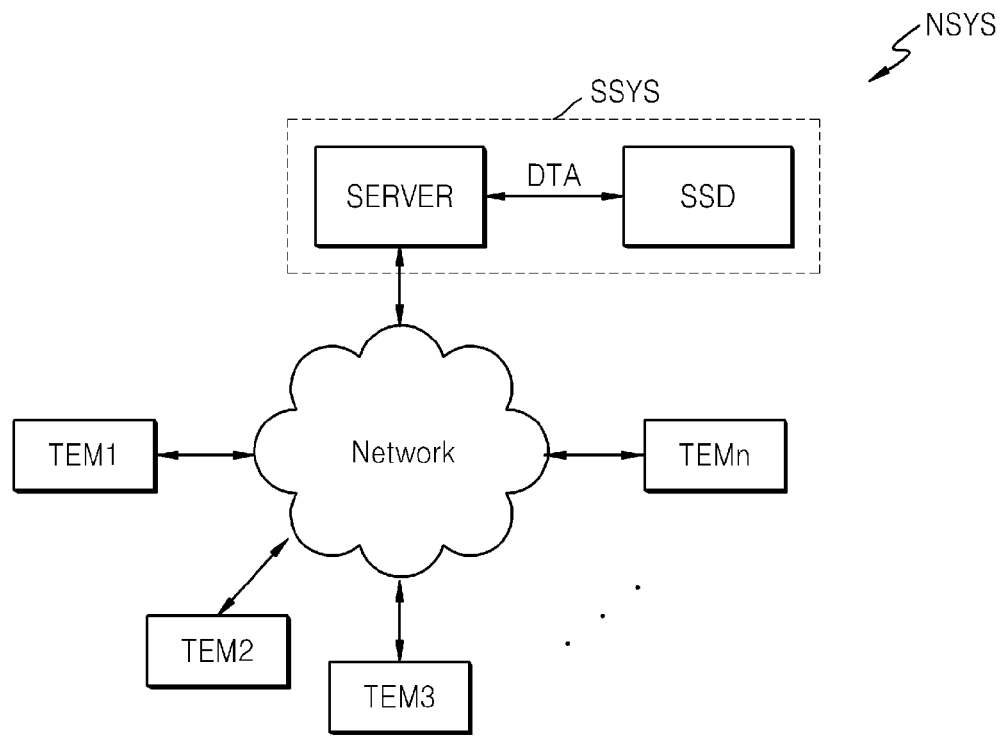
FIG. 12 is a schematic view illustrating a server system and a network system including a semiconductor storage system according to an exemplary embodiment.

FIG. 12 is a schematic view illustrating a server system and a network system including a semiconductor storage system MSYS according to one exemplary embodiment.

Referring to FIG. 12, the network system NSYS may include a server system and a plurality of terminals TEM1 through TEMn that are connected via a network. The server system SSYS according to one embodiment may include a server SERVER that processes requests received from the plurality of terminals TEM1 through TEMn connected to the network and a SSD that stores data corresponding to the request received from the plurality of terminals TEM1 through TEMn. Here, the SSD of FIG. 12 may be identical to the SSD of FIG. 10. That is, the SSD of FIG. 12 may include the control unit CTRL and the memory unit MEM of FIG. 1 or the like.

Figure 13:
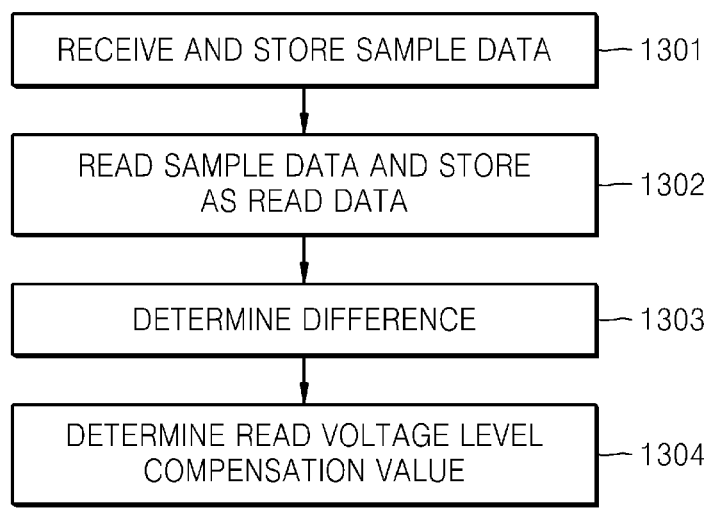
FIG. 13 is a block diagram illustrating an exemplary method of operating a semiconductor device, according to certain exemplary embodiments.

FIG. 13 is a block diagram illustrating an exemplary method of operating a semiconductor device, according to certain exemplary embodiments.

According to FIG. 13, a method of operating a semiconductor device includes: receiving and storing sample data in a first plurality of storage cells (step 1301); reading the sample data and storing the sample data as read data in a second plurality of storage cells (step 1302); determining a difference between the number of storage cells of the first plurality of storage cells that store data having a particular state, and the number of storage cells of the second plurality of storage cells that store data having the particular state (step 1303); and determining a read voltage level compensation value based on the determined difference (step 1304). The steps 1301-1304 may be implemented using, for example, the semiconductor storage system MSYS of FIG. 1, or the systems or devices shown in the other figures.

The first plurality of storage cells may be, for example, a page or an array of memory cells in a memory or in a controller. The second plurality of storage cells may be, for example, a page or an array of memory cells in a buffer.

In one exemplary embodiment, the first plurality of storage cells are single level cells (SLCs), and storing sample data in the first plurality of storage cells causes each cell to be in either a high state or a low state. The second plurality of storage cells may be single level cells (SLCs), and storing read data in the second plurality of storage cells may cause each cell to be in either a high state or a low state. The particular state may be either a high state or a low state.

In another exemplary embodiment, the first plurality of storage cells are multi-level cells (MLCs), and storing sample data in the first plurality of storage cells causes each cell to be in one of a plurality of N states, N being a natural number 3 or greater. The second plurality of storage cells may be multi-level cells (MLCs), and storing read data in the second plurality of storage cells may cause each cell to be in one of a plurality of N states, N being a natural number 3 or greater. The particular state may be one of the N states.

The method may additionally include adjusting the read voltage level based on the read voltage level compensation value, and applying the adjusted read voltage level when performing read operations on the semiconductor device. For example, circuitry within the semiconductor device may be configured to adjust the read voltage level based on the read voltage level compensation value, and to apply the adjust read voltage level, for example to an array of memory cells, when performing read operations on the semiconductor device.

The method may include determining the read voltage level compensation value by either calculating the value or by using a lookup table. For example, the lookup table and/or equations, such as discussed above, may be used to determine the read voltage level compensation value.

While the present disclosure has been particularly shown and described with reference to exemplary embodiments thereof, it will be understood that various changes in form and details may be made therein without departing from the spirit and scope of the following claims.

What is claimed is:

1. A semiconductor storage system comprising:
   a difference determining circuit configured to count a number of occurrences of first state values of read data read from a memory and determine a difference between a number of occurrences of first state values of sample data written to a memory and the number of occurrences of first state values of the read data read from the memory; and
   a compensation value determining circuit configured to determine a read voltage level compensation value corresponding to a difference between the number of occurrences of the first state values of the sample data written to the memory and the number of occurrences of the first state values of the read data read from the memory.

2. The semiconductor storage system of claim 1, further comprising:
   a memory cell array configured to store the read data;
   a voltage source connected to the memory cell array; and
   a circuit configured to adjust a voltage supplied by the voltage source to the memory cell array based on the compensation value.

3. The semiconductor storage system of claim 1, further comprising a generating circuit configured to generate the sample data,
   wherein data written to the memory is the sample data generated by using the generating circuit.

4. The semiconductor storage system of claim 1, wherein the semiconductor storage system is a single level cell (SLC) NAND flash memory, and
   the compensation value determining circuit is configured to calculate a read voltage level compensation value by using a fact that the number of first state values in the read data is equal to the sum of a value obtained by multiplying the number of second state values in the sample data and a probability that the second state values of the sample data may be read as the first state values and a value obtained by multiplying the number of the first state values in the sample data and a probability that the first state values of the sample data may be read as the first state values.

5. The semiconductor storage system of claim 1, wherein the semiconductor storage system is a multi level cell (MLC) NAND flash memory that stores one of first through n-th state values of each memory cell, and
   the compensation value determining circuit is configured to calculate a read voltage level compensation value by using a fact that the number of first state values in the read data is equal to the sum of a value obtained by multiplying the number of second through n-th state values in the sample data and a probability that the second through n-th state values may be read as the first state values and a value obtained by multiplying the number of the first state values in the sample data and a probability that the first state values of the sample data may be read as the first state values.

6. The semiconductor storage system of claim 1, wherein the compensation value determining circuit is configured to determine a read voltage level compensation value corresponding to the difference in the first state values between the sample data written to the memory and the read data read from the memory based on a look-up table (LUT).

7. The semiconductor storage system of claim 1, further comprising a controller that includes the difference determining circuit and the compensation value determining circuit.

8. The semiconductor storage system of claim 1, wherein the semiconductor storage system is a NAND flash memory system.

9. A semiconductor device comprising:
   an array for receiving sample data and recording the sample data;

a buffer for reading and storing the sample data written to the array;

a first circuit for determining a calculated difference between a number of occurrences of arbitrary state values of data written to a memory and a number of occurrences of state values of data read from the memory; and a second circuit for determining a read voltage level compensation value corresponding to the calculated difference between the numbers of the state values.

10. The semiconductor device of claim 9, further comprising:

a third circuit for adjusting a voltage supplied by the voltage source to the memory based on the compensation value.

11. The semiconductor storage device of claim 9, further comprising a third circuit for generating the sample data, wherein the data written to the memory is the sample data generated by using the third circuit.

12. The semiconductor storage system of claim 9, wherein the semiconductor storage system is a single level cell (SLC) NAND flash memory, and the second circuit is configured to calculate a read voltage level compensation value by using a fact that the number of first state values in the read data is equal to the sum of a value obtained by multiplying the number of second state values in the sample data and a probability that the second state values of the sample data may be read as the first state values and a value obtained by multiplying the number of the first state values in the sample data and a probability that the first state values of the sample data may be read as the first state values.

13. The semiconductor storage system of claim 9, wherein the semiconductor storage system is a multi level cell (MLC) NAND flash memory that stores one of first through n-th state values of each memory cell, and the second circuit is configured to calculate a read voltage level compensation value by using a fact that the number of first state values in the read data is equal to the sum of a value obtained by multiplying the number of second through n-th state values in the sample data and a probability that the second through n-th state values may be read as the first state values and a value obtained by multiplying the number of the first state values in the sample data and a probability that the first state values of the sample data may be read as the first state values.

14. The semiconductor storage system of claim 9, wherein the second circuit is configured to determine a read voltage level compensation value corresponding to the difference in the state values between the data written to the memory and the data read from the memory based on a look-up table (LUT).

15. The semiconductor storage system of claim 9, further comprising a controller that includes the first circuit and the second circuit.

16. A method of operating a semiconductor device, the method comprising:

receiving and storing sample data in a first plurality of storage cells;

reading the sample data and storing the sample data as read data in a second plurality of storage cells;

determining a difference between the number of storage cells of the first plurality of storage cells that store data having a particular state, and the number of storage cells of the second plurality of storage cells that store data having the particular state; and determining a read voltage level compensation value based on the determined difference.

17. The method of claim 16, further comprising:

adjusting the read voltage level based on the read voltage level compensation value; and applying the adjusted read voltage level when performing read operations on the semiconductor device.

18. The method of claim 16, wherein:

the first plurality of storage cells are single level cells (SLCs), and storing sample data in the first plurality of storage cells causes each cell to be in either a high state or a low state;

the second plurality of storage cells are single level cells (SLCs), and storing read data in the second plurality of storage cells causes each cell to be in either a high state or a low state; and the particular state is either the high state or the low state.

19. The method of claim 16, wherein:

the first plurality of storage cells are multi-level cells (MLCs), and storing sample data in the first plurality of storage cells causes each cell to be in one of a plurality of N states, N being a natural number 3 or greater;

the second plurality of storage cells are multi-level cells (MLCs), and storing read data in the second plurality of storage cells causes each cell to be in one of a plurality of N states, N being a natural number 3 or greater; and the particular state is one of the N states.

20. The method of claim 16, further comprising:

determining the read voltage level compensation value by either calculating the value or by using a lookup table.

* * * * *